(12) United States Patent
Fasshauer et al.

(10) Patent No.: US 8,148,999 B2
(45) Date of Patent: Apr. 3, 2012

(54) PROXIMITY DETECTOR

(75) Inventors: Peter Fasshauer, Neubiberg (DE); Hans Schwaiger, Munich (DE)

(73) Assignee: Ident Technology AG, Wessling (DE)

( * ) Notice: Subject to any disclaimer, the term of this patent is extended or adjusted under 35 U.S.C. 154(b) by 0 days.

(21) Appl. No.: 12/446,657

(22) PCT Filed: Sep. 15, 2008

(86) PCT No.: PCT/EP2008/007662
§ 371 (c)(1),
(2), (4) Date: Apr. 30, 2009

(87) PCT Pub. No.: WO2009/062562
PCT Pub. Date: May 22, 2009

(65) Prior Publication Data
US 2011/0062963 A1      Mar. 17, 2011

(30) Foreign Application Priority Data
Sep. 13, 2007   (DE) .................. 10 2007 043 629

(51) Int. Cl.
*G01R 27/00* (2006.01)
*G01R 27/14* (2006.01)

(52) U.S. Cl. ......... 324/632; 324/637; 324/654; 324/660
(58) Field of Classification Search .................. 324/632, 324/654, 660
See application file for complete search history.

(56) References Cited

U.S. PATENT DOCUMENTS

| RE25,100 E | 12/1961 | Chapin ........................... 367/93 |
| 3,826,979 A | 7/1974 | Steinmann ..................... 361/178 |
| 4,016,490 A | 4/1977 | Weckenmann ................ 324/671 |
| 4,071,820 A | 1/1978 | Mushinsky ..................... 324/671 |
| 5,670,886 A | 9/1997 | Wolff et al. .................... 324/644 |
| 6,366,099 B1 | 4/2002 | Reddi ............................ 324/678 |

*Primary Examiner* — Huy Q Phan
*Assistant Examiner* — Emily Chan
(74) *Attorney, Agent, or Firm* — Andrew Wilford

(57) ABSTRACT

A circuit for generating an indicative signal regarding the approach of an object to an observation area has a send electrode device, a generator circuit for supplying alternating voltage to the send electrode device, a receive electrode device which extends in or along the observation area, and an output circuit for generating an output signal correlating with the field at the receive electrode device. A compensation circuit is provided to add a compensation current $i_2$ to a signal current $i_1$ flowing from the receive electrode device.

8 Claims, 2 Drawing Sheets

Fig. 4  Fig. 5

PROXIMITY DETECTOR

CROSS REFERENCE TO RELATED APPLICATIONS

This application is the U.S. national stage of PCT application PCT/EP2008/007662, filed 15 Sep. 2008 and claiming the priority of German patent application 102007043629.9 itself filed 13 Nov. 2007, whose entire disclosures are herewith incorporated by reference.

FIELD OF THE INVENTION

The invention involves a method and a circuit for detecting the approach of an object, in particular a person, to an electrode device on the basis of electric field interaction effects.

SUMMARY OF THE INVENTION

The object of the invention is to create solutions with which the approach of an object to an electrode device can be implemented in a way which is relatively insensitive to other interfering influences.

This task is solved in accordance with a first aspect of the present invention by a circuit comprising a send electrode, a generator for supplying alternating voltage to the send electrode, a receive electrode that extends into or along the observation area, an output circuit for generating an output signal correlating with the field at the receive electrode device, and a compensation circuit to add a compensation current $i_2$ to a signal current $i_1$ flowing from the receive electrode device.

The approach in accordance with the invention makes it advantageously possible to achieve high sensor sensitivity while preventing overriding of the circuit linked with the receiver electrode device.

BRIEF DESCRIPTION OF THE DRAWING

Further details and features of the invention are set out in the following description in conjunction with the drawings. Therein:

FIG. 4 a diagram further showing the generation in accordance with the invention of an output signal in a proximity sensor device, in particular a window lock; and FIG. 5 is a graph illustrating the instant invention.

DETAILED DESCRIPTION

The concept in accordance with the invention is based on a method in which an alternating electric field in the frequency range of preferably 80 to 150 kHz is generated between a send electrode Tx and a receive electrode Rx. If a conducting object, e.g. a part of the body, enters this field between the electrodes Tx and Rx, there is a partial absorption of this field through the body which leads to a weakening of the receive signal fed to an amplifier connected to the receive electrode Rx. The absolute signal alteration which arises hereby at the receiver output is directly proportional to the amplitude of the carrier generated by a generator at the send electrode Tx.

In order to achieve the largest possible signal alteration and thus high sensor sensitivity on approach of an object, the generator voltage is set as high as possible. Up to now a limitation of this was only possible subject to basic restrictions on the controllability of an amplifier connected on the receiver side.

Figure 2:
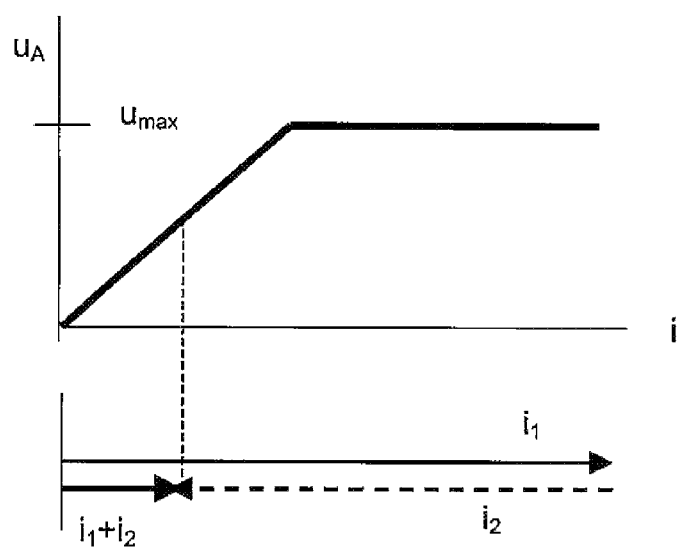
FIG. 2 a graph showing the evaluation voltage displacement to the proportional range by the partial current $i_2$.

FIG. 2 shows a graph of the relationship between input current and output current. The input current is proportional to the generator voltage.

In the range of relatively low input currents there is a linear relationship which is subject to limitation when a maximum voltage is reached. An alteration of the input current can only be detected in the linear range.

With the aid of the concept in accordance with the invention it is possible to hold the signal alteration in the linear range even if the signal current or the generator voltage is far above the limitation range, which makes it possible to achieve substantially higher sensor sensitivity.

Figure 1:
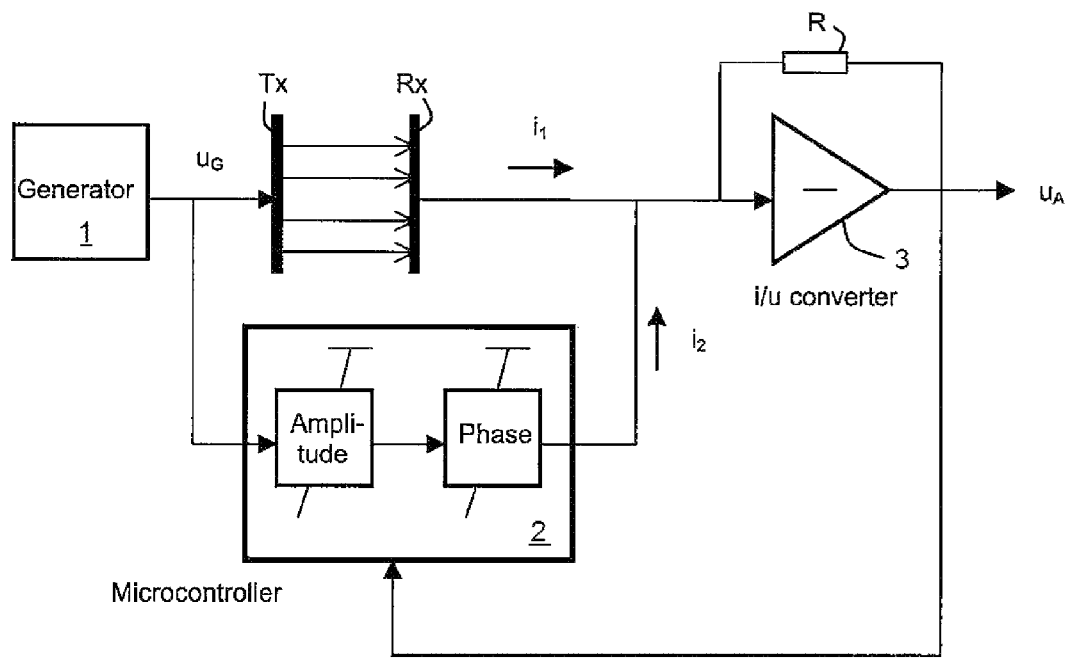
FIG. 1 a diagram showing the basic structure of a sensor circuit in accordance with the invention.

The basic principle of the circuit in accordance with the invention and the compensation method allows for field absorption sensors FIG. 1 is a diagram illustrating the main features of the concept in accordance with the invention as well as the functions of the method.

A generator 1 generates a carrier signal $u_G$ in the frequency range 80 kHz to 150 kHz. This signal is applied on the one hand to the send electrode Tx and on the other hand to the input of a compensation stage 2, with which the amplitude and the phase angle of a compensation signal can be set which as partial current $i_2$ along with the signal current $i_1$ supplied by the receive electrode Rx forms the input current $i=i_1+i_2$ for a subsequent current/voltage converter 3 at whose output a voltage then arises $$u_A = -R(i_1+i_2) \tag{1}$$

There are also the following relationships between the introduced quantities in which only the magnitudes (amplitudes) are observed. It is also assumed that, apart from a phase displacement of 180°, there are no other phase deviations between $i_1$ and $i_2$, which can be achieved by a suitable compensation method. With an absorption coefficient a, which describes the signal alteration due to the field absorption relative to the basic condition, we then receive $$i_1 = k_1(1-a)uG \tag{2}$$

$$i_2 = -k_2 u_G \tag{3}$$

whereby $k_1$ and $k_2$ are proportionality factors for the amplitudes. Thus equation 1 becomes $$u_A = -u_G R[k_1(1-a)-k_2] \tag{4}$$

The maximum compensation then results for $k_1=k_2$, so that equation 4 becomes $$u_A = u_G k_1 aR \tag{5}$$

Where $u_{G1}$ is thus the required send voltage in the uncompensated case ($k_2=0$) to achieve a maximum output voltage $u_{max}$ (see FIG. 2). Thus from equation 4 we derive $$u_{G1} = u_{max}/k_1(1-a)R \tag{6}$$

For the compensated case in accordance with equation 5, it follows that $$u_{G2} = u_{max}/k_1 aR \tag{7}$$

The ratio of the send voltages in both cases represents the increase in sensitivity as the permissible signal current $i_1$ and thus its alteration, is proportional to $u_G$, as was already explained. With the equations (6) and (7), this amounts to $$u_{G2}/u_{G1} = (1-a)/a \tag{8}$$

For a=0.1 for example, we obtain 9× higher sensitivity of the sensor.

Realization of the Method

An expedient, practical implementation of the method consists in realizing the compensation channel largely with the aid of a microcontroller with integrated analog/digital and digital/analog converters, as this is the most flexible way of solving the tasks of adapting amplitude and phase to the measurement signal via the software. In particular, it is relatively easy to make adaptations to time-variant systems, for example how they relate to each other on movements of the send and receive electrodes. Here it is necessary to alter the compensation signal to the same extent as the alteration of the sensor signal. By feedback of the output signal of the i/u converter to the microcontroller (see FIG. 1) the balance can also be automated.

Advantages of the Method

With the increase of the sensor sensitivity described above, the method in accordance with the invention also offers the advantage of working with substantially longer sensor electrodes, so that electrode segmentation can be dispensed with as applicable, which means considerable simplification and cost-savings in the production method for such sensor systems.

Figure 3:
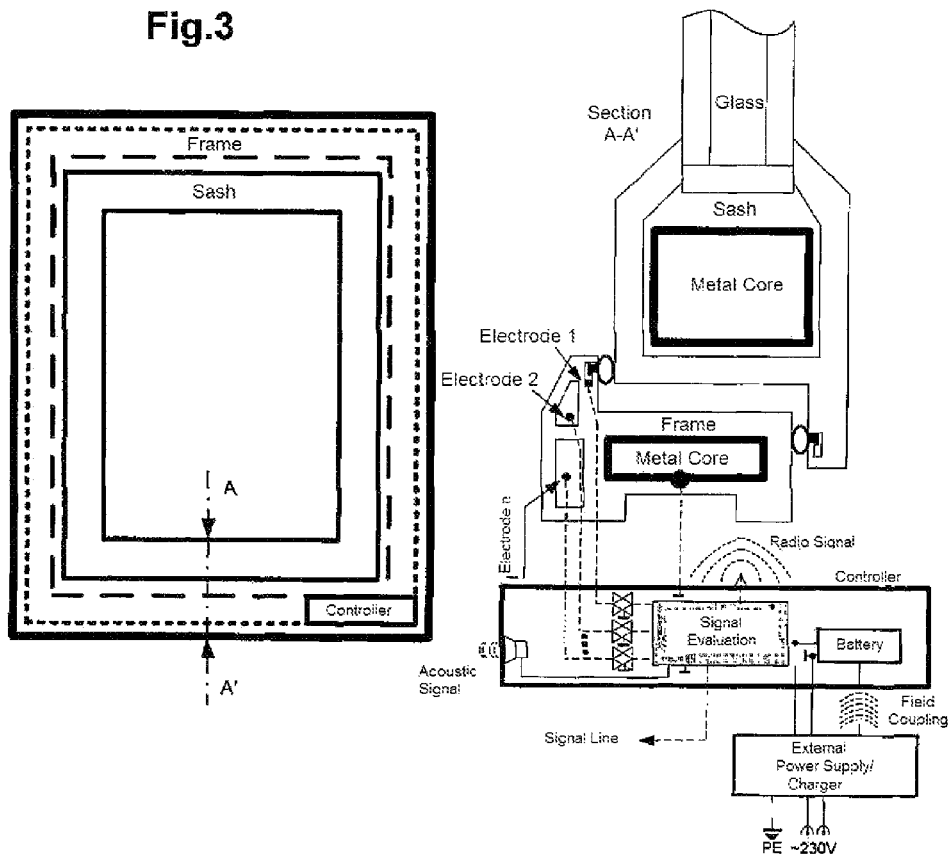
FIG. 3 a diagram showing an application example of the circuit in accordance with the invention in a window lock.
Figure 3:
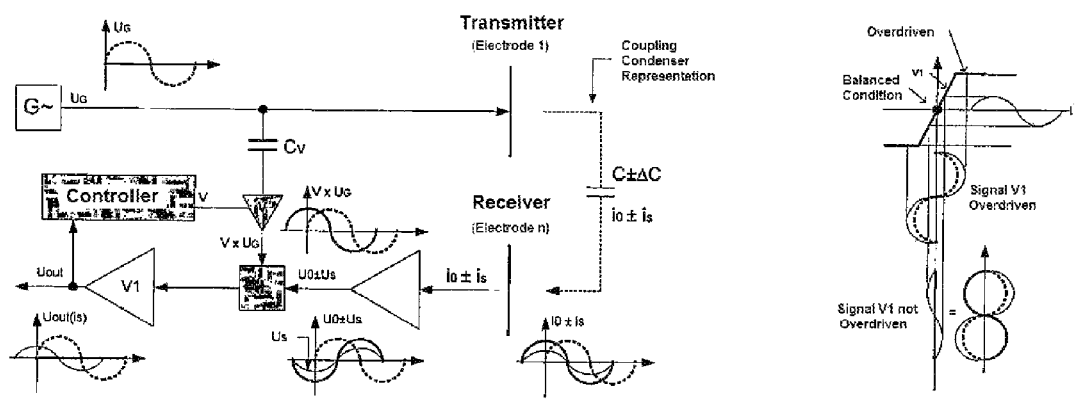

FIG. 3 shows an embodiment of the invention as an anti-burglary window lock. The send and/or receive electrodes preferably integrated into the stationary window frame can consist of a single conductor or segments.

It is possible to generate the signals by calling up several electrodes (1 ... n) and to use the relation of the signals to each other not only for alarm detection, but also to compensate for environmental influences and drift.

The electrodes can be arranged in a loop and carry a measurement current which serves to detect breaks in the line (defect, sabotage etc.).

The electronics can be mains and/or battery powered (e.g. back-up power supply).

The energy to charge the batteries and/or for the operation of the electronics can be supplied via a field coupling mechanism (E-field, H-field).

A metal core in the frame typically provided for structural reasons can serve as the earth for the electronics. Alternatively, the earth can be provided by metal foils suitably integrated in the frame. The earth potential/protective conductor potential can serve as earth for the electronics.

The electrodes and the electronics are preferably accommodated only in the frame (no moving line to the wing). The alarm can be given acoustically and/or via radio and/or via a recording line.

As the circuit diagram in FIG. 4 and the graph in FIG. 5 show, the generator alternating voltage is applied to the send electrode 1. A capacitive current (leading by 90°) couples it with the receive electrode n. The capacitive current is converted to a 90° leading, inverted voltage by an i/u converter. This voltage is added to a voltage leading by 90° through capacitor Cv and multiplied by a factor v. By controlling v, the output voltage $U_{out}$ can be reduced to the minimum (ideal=0) in the compensation or balanced state DC=O.

Compensated State

In the case of a capacity alteration AC the amplitude of the capacitive current Is is altered. After the adder (+) all that remains from the output voltage of the I/U converter is a voltage amplitude proportional to the capacity alteration AC. This can be amplified by the subsequent amplifier Vi without overdriving it.

The invention claimed is:

1. A circuit for generating a signal indicating the approach of an object to an observation area, the circuit comprising:
   a send electrode immediately adjacent the observation area;
   a generator for supplying alternating voltage to the send electrode to create adjacent the send electrode in the observation area an alternating electrical field;
   a receive electrode extending in or along the observation area for outputting an alternating electrical signal current $i_1$ that varies as the object enters the area,
   a compensator for adding to the outputted signal current $i_1$ of the receive electrode an alternating compensation signal current $i_2$ having a phase offset by 180° to the signal current $i_1$, and
   an output circuit for receiving the added signals $i_1$ and $i_2$ and generating an output signal correlating with the field at the receive electrode.

2. The circuit in accordance with claim 1 wherein the compensation current is triggered via the generator voltage.

3. The circuit in accordance with claim 1 wherein the amplitude of the compensation current is adapted in accordance with the output signal.

4. The circuit in accordance with claim 1 wherein the output circuit is in the form of an i/u converter.

5. The circuit in accordance with claim 1 wherein the compensation circuit is a microcontroller.

6. A method of generating a signal indicating the approach of an object to an observation area, the method comprising the steps of:
   feeding to a send electrode immediately juxtaposed with the observation area an alternating current to form in the area an alternating electrical field,
   detecting the field with a receive electrode extending in or along the observation area and outputting a signal current, and
   adding to the outputted signal current $i_1$ of the receive electrode an alternating compensation signal current $i_2$ having a phase offset by 180° to the signal current $i_1$, and generating with an output circuit an output signal correlating with the field at the receive electrode.

7. The method in accordance with claim 6 wherein the output signal is generated using a converter coupled with the receive electrode device.

8. The method in accordance with claim 6 wherein the output signal is suspended in the area of the compensation circuit.

* * * * *